(12) United States Patent
Shihommatsu et al.

(10) Patent No.: US 11,488,807 B2
(45) Date of Patent: Nov. 1, 2022

(54) PLASMA PROCESSING APPARATUS, PROCESSING METHOD, AND UPPER ELECTRODE STRUCTURE

(71) Applicant: Tokyo Electron Limited, Tokyo (JP)

(72) Inventors: Kota Shihommatsu, Miyagi (JP); Junji Ishibashi, Miyagi (JP); Junichi Sasaki, Miyagi (JP); Hidetoshi Hanaoka, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 139 days.

(21) Appl. No.: 17/005,587

(22) Filed: Aug. 28, 2020

(65) Prior Publication Data

US 2021/0074520 A1    Mar. 11, 2021

(30) Foreign Application Priority Data

Sep. 5, 2019    (JP) .............................. JP2019-162324

(51) Int. Cl.
*H01J 37/32*    (2006.01)

(52) U.S. Cl.
CPC .... *H01J 37/32532* (2013.01); *H01J 37/3244* (2013.01); *H01J 37/32082* (2013.01); *H01J 37/32642* (2013.01); *H01J 2237/334* (2013.01)

(58) Field of Classification Search
None
See application file for complete search history.

(56) References Cited

U.S. PATENT DOCUMENTS

| 4,857,132 | A | * | 8/1989 | Fisher | H01L 21/67017 |
| | | | | | 156/345.33 |
| 4,882,028 | A | * | 11/1989 | Chhabra | H01J 37/32577 |
| | | | | | 156/345.43 |
| 5,138,973 | A | * | 8/1992 | Davis | C23C 16/482 |
| | | | | | 156/345.35 |
| 5,310,453 | A | * | 5/1994 | Fukasawa | H01L 21/67098 |
| | | | | | 438/716 |
| 2005/0009347 | A1 | * | 1/2005 | Matsumoto | H01J 37/32174 |
| | | | | | 257/E21.252 |
| 2005/0103275 | A1 | * | 5/2005 | Sasaki | H01J 37/32706 |
| | | | | | 118/728 |
| 2006/0219178 | A1 | * | 10/2006 | Asakura | H01L 21/68742 |
| | | | | | 118/728 |

(Continued)

FOREIGN PATENT DOCUMENTS

JP    2017-212051    11/2017
JP    2017212051 A * 11/2017    ........ H01J 37/32009

*Primary Examiner* — Srinivas Sathiraju
(74) *Attorney, Agent, or Firm* — IPUSA, PLLC

(57) ABSTRACT

An apparatus for plasma processing includes a chamber, a lower electrode on which a substrate is placed in the chamber, an edge ring disposed around the lower electrode, an upper electrode facing the lower electrode in the chamber, a member disposed around the upper electrode, a gas supply section configured to supply a process gas to a space between the member and the lower electrode, and a power supply for applying radio frequency power to the lower electrode or the upper electrode to generate a plasma of the process gas. The member includes an inner member and an outer member positioned outside the inner member, and the outer member is disposed outside the edge ring in a radial direction. At least part of the outer member is movable in a vertical direction.

19 Claims, 6 Drawing Sheets

(56) References Cited

U.S. PATENT DOCUMENTS

| | | | | |
|---|---|---|---|---|
| 2007/0089835 | A1* | 4/2007 | Koshimizu | H01J 37/32935 257/E21.252 |
| 2008/0216864 | A1* | 9/2008 | Sexton | B08B 7/0035 134/1.2 |
| 2009/0015165 | A1* | 1/2009 | Jeon | H01J 37/32165 315/111.51 |
| 2009/0305509 | A1* | 12/2009 | Stevenson | H01J 37/32541 118/667 |
| 2010/0243167 | A1* | 9/2010 | Hayashi | H01L 21/67069 156/345.43 |
| 2011/0073257 | A1* | 3/2011 | Dhindsa | H01J 37/32834 156/345.43 |
| 2011/0108524 | A1* | 5/2011 | Dhindsa | H01J 37/32642 156/345.1 |
| 2012/0160418 | A1* | 6/2012 | Hanaoka | H01J 37/32623 156/345.38 |
| 2012/0212135 | A1* | 8/2012 | Suzuki | H01J 37/32926 315/111.21 |
| 2014/0020708 | A1* | 1/2014 | Kim | H01J 37/32091 134/1.1 |
| 2015/0114563 | A1* | 4/2015 | Hirano | H01J 37/32082 315/111.21 |
| 2015/0325414 | A1* | 11/2015 | Dhindsa | H01J 37/32834 156/345.26 |
| 2016/0056021 | A1* | 2/2016 | Tsujimoto | H01J 37/32082 156/345.26 |
| 2017/0092513 | A1* | 3/2017 | Hosaka | C23C 16/45587 |
| 2017/0330735 | A1* | 11/2017 | Dhindsa | H01J 37/32082 |
| 2017/0338084 | A1* | 11/2017 | Nishijima | H01J 37/32183 |
| 2018/0315640 | A1* | 11/2018 | Ueda | H01J 37/32642 |
| 2019/0088454 | A1* | 3/2019 | Son | H01L 21/67069 |
| 2019/0108986 | A1* | 4/2019 | Saitoh | H01J 37/32724 |
| 2019/0252218 | A1* | 8/2019 | Ueda | H01L 21/68764 |
| 2019/0318918 | A1* | 10/2019 | Saitoh | H01J 37/3299 |
| 2019/0326092 | A1* | 10/2019 | Ogasawara | H01J 37/32458 |
| 2019/0333785 | A1* | 10/2019 | Tanikawa | H01L 21/67069 |
| 2021/0074520 | A1* | 3/2021 | Shihommatsu | H01J 37/32642 |
| 2021/0280399 | A1* | 9/2021 | Pan | H01J 37/32834 |
| 2021/0296096 | A1* | 9/2021 | Ishima | H01J 37/32642 |
| 2021/0358779 | A1* | 11/2021 | Ueda | H01L 21/67126 |

* cited by examiner

PLASMA PROCESSING APPARATUS, PROCESSING METHOD, AND UPPER ELECTRODE STRUCTURE

CROSS-REFERENCE TO RELATED APPLICATIONS

This patent application is based on and claims priority to Japanese Patent Application No. 2019-162324 filed on Sep. 5, 2019, the entire contents of which are incorporated herein by reference.

TECHNICAL FIELD

The present disclosure relates to a plasma processing apparatus, a processing method, and an upper electrode structure.

BACKGROUND

When the sheath is tilted near the boundary between a focus ring and a substrate due to abrasion of the focus ring, incidence of ions becomes oblique, and an etching profile does not become vertical and becomes tilted at an edge region of the substrate. A tilted etching profile is also referred to as a tilting shape. Patent Document 1 proposes a method of reducing a tilt angle of an etching profile.

RELATED ART DOCUMENT

Patent Document

[Patent Document 1] Japanese Laid-open Patent Application Publication No. 2017-212051

SUMMARY

The present disclosure provides a plasma processing apparatus, a processing method, and an upper electrode structure that suppresses increase in tilting of an etching profile that occurs in an edge region of a substrate in accordance with aging (abrasion) of the edge ring.

According to one aspect of the present disclosure, an apparatus for plasma processing includes a chamber, a lower electrode on which a substrate is placed in the chamber, an edge ring disposed around the lower electrode, an upper electrode facing the lower electrode in the chamber, a member disposed around the upper electrode, a gas supply section configured to supply a process gas to a space between the member and the lower electrode, and a power supply for applying radio frequency power to the lower electrode or the upper electrode to generate a plasma of the process gas. The member includes an inner member and an outer member positioned outside the inner member, and the outer member is disposed outside the edge ring in a radial direction. At least part of the outer member is movable in a vertical direction.

DETAILED DESCRIPTION OF EMBODIMENTS

In the following, embodiments of the present disclosure will be described with reference to the drawings. Note that in the following drawings, elements having identical features are given the same reference symbols and overlapping descriptions may be omitted.

[Plasma Processing Apparatus]

Figure 1:
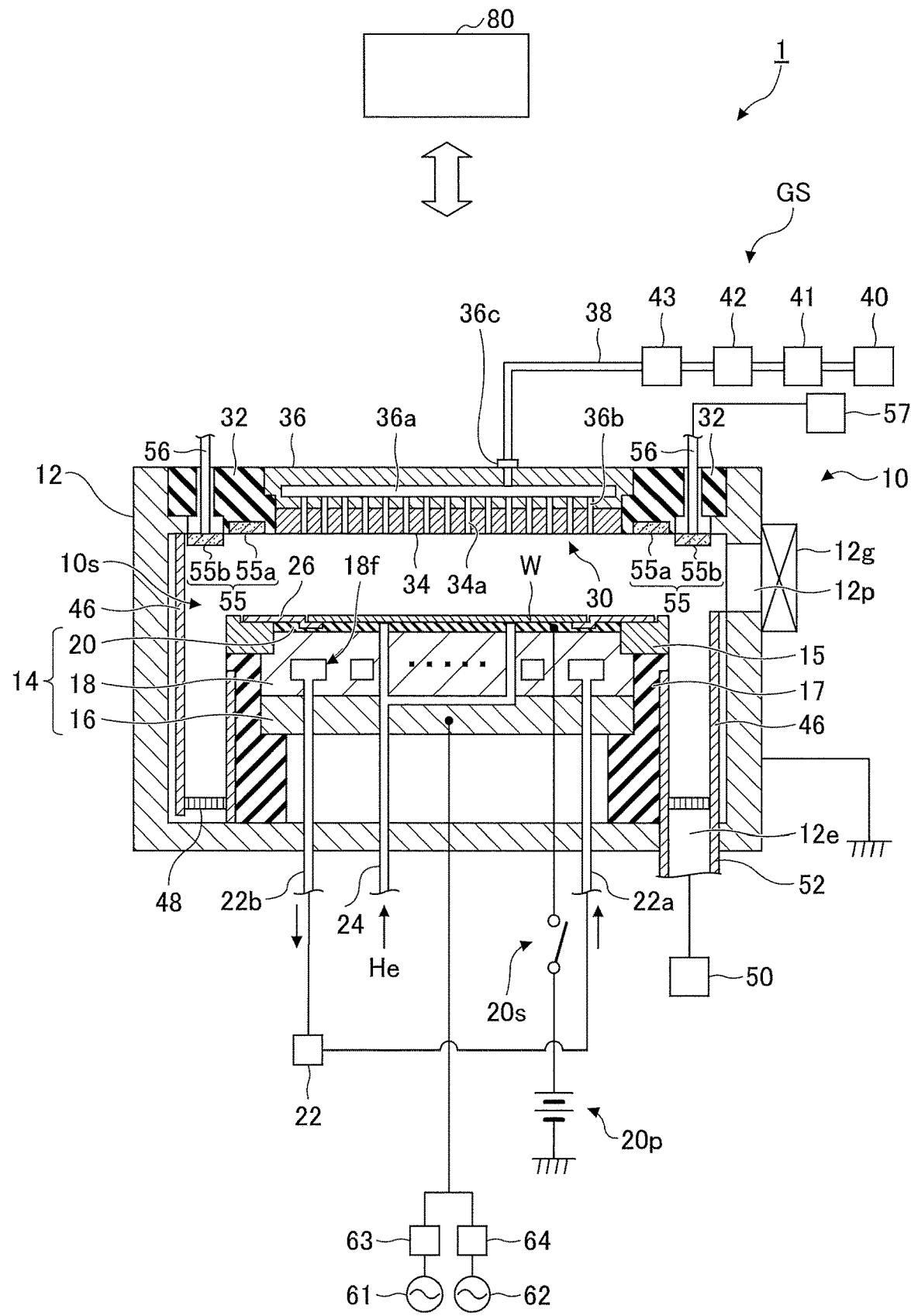
FIG. 1 is a cross-sectional view illustrating an example of a plasma processing apparatus according to an embodiment.

FIG. 1 is a schematic diagram illustrating an apparatus for plasma processing (hereinafter referred to as a "plasma processing apparatus 1") according to an embodiment. The plasma processing apparatus 1 illustrated in FIG. 1 is a capacitively coupled apparatus. The plasma processing apparatus 1 includes a chamber 10. The chamber 10 provides an inner space 10s therein.

The chamber 10 includes a chamber body 12. The shape of the chamber body 12 is generally cylindrical. The inner space 10s is provided inside the chamber body 12. The chamber body 12 is formed of, for example, aluminum. On the inner wall surface of the chamber body 12, a film that is corrosion resistant to plasma is formed. The corrosion-resistant film has a multilayered film structure formed of a ceramic, such as yttrium oxide or mullite, and a resin. The structure of the multilayered film will be described below.

A passage 12p is formed in the side wall of the chamber body 12. The passage 12p can be opened and closed by the gate valve 12g. A gate valve 12g is provided along the side wall of the chamber body 12.

When a substrate W is conveyed between the inner space 10s and the exterior of the chamber 10, the gate valve 12g is opened and the substrate W is loaded from the passage 12p into the chamber 10.

A support 17 is provided on the bottom of the chamber body 12. The support 17 is formed of an insulating material. The shape of the support 17 is generally cylindrical. The support 17 extends upward from the bottom of the chamber body 12 in the inner space 10s. A member 15 is provided on the support 17. The member 15 is formed of an insulating material such as quartz. The member 15 may be generally cylindrical. Alternatively, the member 15 may be an annular plate.

The plasma processing apparatus 1 further includes a substrate support, i.e., a lower electrode 14 according to one exemplary embodiment. The lower electrode 14 is supported by the support 17. The lower electrode 14 is provided in the inner space 10s. The lower electrode 14 is configured to support a substrate W in the chamber 10, i.e., in the inner space 10s.

The lower electrode 14 includes a base 18 and an electrostatic chuck 20 according to one exemplary embodiment. The lower electrode 14 may further include an electrode plate 16. The electrode plate 16 is formed from a conductor, such as aluminum, and is generally of a disc-shape. The base 18 is provided on the electrode plate 16. The base 18 is formed from a conductor, such as aluminum, and is generally of a disc-shape. The base 18 is electrically connected to the electrode plate 16. The outer side surface of the base 18 and the outer side surface of the electrode plate 16 are surrounded by the support 17.

The electrostatic chuck 20 is provided on the base 18. An electrode is embedded in the electrostatic chuck 20. The electrode of the electrostatic chuck 20 is connected to a direct-current (DC) power supply 20p via a switch 20s. When voltage is applied from the DC power supply 20p to the electrode of the electrostatic chuck 20, electrostatic attractive force is generated between the electrostatic chuck 20 and the substrate W. The substrate W is held to the electrostatic chuck 20 by the electrostatic attractive force.

The edge of the electrostatic chuck 20 and the outer side surface of the base 18 are surrounded by the member 15. The electrostatic chuck 20 supports the substrate W and an edge ring 26 according to one exemplary embodiment. The edge ring 26 is also referred to as a focus ring. The substrate W has a general disc shape, for example, and is placed on the electrostatic chuck 20. The edge ring 26 is placed on the electrostatic chuck 20 to surround the edge of the substrate W. The outer peripheral portion of the edge ring 26 may extend on the member 15.

A flow passage 18f is provided within the base 18. A heat exchange medium (e.g., refrigerant) is supplied to the flow passage 18f from a chiller unit 22 provided outside the chamber 10 through a pipe 22a. The heat exchange medium supplied to the flow passage 18f is returned to the chiller unit 22 via a pipe 22b. In the plasma processing apparatus 1, a temperature of a substrate W placed on the electrostatic chuck 20 is regulated by heat exchange between the heat exchange medium and the base 18.

The plasma processing apparatus 1 is provided with a gas supply line 24. The gas supply line 24 supplies a heat transfer gas (e.g., He gas) from a heat transfer gas supply mechanism to a gap between the upper surface of the electrostatic chuck 20 and the bottom surface of the substrate W.

The plasma processing apparatus 1 further includes an upper electrode 30. The upper electrode 30 is disposed above the lower electrode 14. The upper electrode 30 is a counter electrode of the lower electrode 14. The upper electrode 30 is supported at an upper portion of the chamber body 12 via a member 32. The member 32 is formed of an insulating material such as quartz. The upper electrode 30 and the member 32 occlude the top opening of the chamber body 12.

The upper electrode 30 may include a top plate 34 and a support 36. The lower surface of the top plate 34 is exposed to the inner space 10s, and defines the inner space 10s. The top plate 34 may be formed of a low resistance conductor or semiconductor with low Joule heat generation. Multiple gas discharge holes 34a are formed in the top plate 34. The multiple gas discharge holes 34a penetrate the top plate 34 in a thickness direction of the top plate 34.

The lower electrode 14 is an electrode to which a second radio frequency power supply 62 is connected, and is also a stage on which the substrate is placed.

The support 36 removably supports the top plate 34. The support 36 is formed of an electrically conductive material such as aluminum. Inside the support 36, a gas diffusion chamber 36a is provided. Multiple gas holes 36b are formed in the support 36. The multiple gas holes 36b extend downward from the gas diffusion chamber 36a. The multiple gas holes 36b communicate with the multiple gas discharge holes 34a, respectively. A gas inlet 36c is formed in the support 36. The gas inlet 36c is connected to the gas diffusion chamber 36a. A gas supply line 38 is connected to the gas inlet 36c.

A gas supply section GS is connected to the gas supply line 38. The gas supply section GS supplies a process gas to a processing space between the upper electrode 30 and the lower electrode 14. The gas supply section GS includes gas sources 40, valves 41, flow controllers 42, and valves 43. The gas sources 40 are connected to the gas supply line 38 via valves 41, flow controllers 42, and valves 43. Each of the valves 41 and 43 is an open/close valve. Each of the flow controllers 42 is a mass flow controller or a pressure controlled flow controller. Each of the gas sources 40 is connected to the gas supply line 38 via a corresponding open/close valve of the valves 41, a corresponding flow controller of the flow controllers 42, and a corresponding open/close valve of the valves 43.

In the plasma processing apparatus 1, a deposition shield 46 is removably provided along the inner wall surface of the chamber body 12. The deposition shield 46 is also provided around the outer side surface of the support 17. The deposition shield 46 prevents etching by-products from adhering to the chamber body 12. The deposition shield 46 is constructed by, for example, forming a corrosion resistant film on a surface of a member formed of aluminum. The corrosion resistant film may be a film formed from a ceramic such as yttrium oxide.

A baffle plate 48 is provided between the outer side wall of the support 17 and the inner side wall of the chamber body 12. The baffle plate 48 is constructed by, for example, forming a corrosion resistant film on a surface of a member formed of aluminum. The corrosion resistant film may be a film formed from a ceramic such as yttrium oxide. Multiple through-holes are formed in the baffle plate 48. Below the baffle plate 48, an exhaust port 12e is provided at the bottom of the chamber body 12. An exhaust device 50 is connected to the exhaust port 12e via an exhaust pipe 52. The exhaust device 50 includes a pressure regulating valve and a vacuum pump such as a turbomolecular pump.

The plasma processing apparatus 1 further includes a first radio frequency power supply 61. The first radio frequency power supply 61 is configured to generate first radio frequency power for plasma generation. The frequency of the first radio frequency power is, for example, in a range of 27 MHz to 100 MHz.

The first radio frequency power supply 61 is electrically connected to the base 18 via a matcher 63. The matcher 63 includes matching circuitry. The matching circuitry of the matcher 63 is configured to cause impedance of a load (lower electrode side) of the first radio frequency power supply 61 to match the output impedance of the first radio frequency power supply 61. In another embodiment, the first radio frequency power supply 61 may be electrically connected to the upper electrode 30 via the matcher 63. The first radio frequency power supply 61 is an example of a radio frequency power supply that applies the first radio frequency power to the lower electrode 14 or the upper electrode 30 to generate a plasma of a process gas.

The plasma processing apparatus 1 may further include a second radio frequency power supply 62. The second radio frequency power supply 62 is configured to generate second radio frequency power for drawing ions. That is, the second radio frequency power has a frequency that is primarily suitable for drawing positive ions into a substrate W. The frequency of the second radio frequency power is, for example, in a range of 400 kHz to 13.56 MHz.

The second radio frequency power supply 62 is electrically connected to the base 18 via a matcher 64. The matcher 64 includes matching circuitry. The matching circuitry of the matcher 64 is configured to cause impedance of a load of the second radio frequency power supply 62 to match the output impedance of the second radio frequency power supply 62.

The plasma processing apparatus 1 may further include a controller 80. The controller 80 may be a computer including a processor, a storage device such as a memory, an input device, a display device, a signal input/output interface, or the like. The controller 80 controls each part of the plasma processing apparatus 1. In the controller 80, by using the input device, an operator can perform input operations of commands to manage the plasma processing apparatus 1. The controller 80 can also display an operation status of the plasma processing apparatus 1 on the display device. The storage device of the controller 80 stores a control program and recipe data. The control program is executed by the processor of the controller 80 to cause the plasma processing apparatus 1 to perform various processes. By the processor of the controller 80 executing the control program and controlling each part of the plasma processing apparatus 1 in accordance with the recipe data, various processes, for example, processing methods, are performed in the plasma processing apparatus 1.

[Upper Electrode Structure]

An upper electrode structure includes the upper electrode 30 and a member 55 disposed around the upper electrode 30. The member 55 disposed around the upper electrode 30 includes an inner member 55a and an outer member 55b located outside the inner member 55a.

Each of the inner member 55a and the outer member 55b may be a ring-shaped member, or may be composed of multiple circular arc-shaped members. Alternatively, the inner member 55a and the outer member 55b may be a step-like shape. The inner member 55a and the outer member 55b may be disposed at any locations as long as the inner member 55a and the outer member 55b are disposed generally concentrically to the central axis of the upper electrode 30.

The inner member 55a and the outer member 55b are formed of silicon. However, the material of the inner member 55a and the outer member 55b is not limited thereto, and the material may be a semiconductor such as SiC, or an electrically conductive material. For example, the material of the inner member 55a and the outer member 55b may be a metal such as aluminum. Alternatively, the material of the inner member 55a and the outer member 55b may be another electrically conductive member that can be used in the chamber 10. In the present embodiment, a cross section of each of the inner member 55a and the outer member 55b is rectangular, but the inner member 55a and the outer member 55b may have a tapered cross-section.

The upper electrode 30 is electrically insulated from the inner member 55a through the member 32 formed of quartz. Similarly, the inner member 55a is electrically insulated from the outer member 55b through the member 32. The inner member 55a may be electrically insulated from the upper electrode 30 and the outer member 55b via a vacuum space, or may be electrically insulated via an insulating member other than quartz.

The inner member 55a is secured to the member 32. The outer member 55b is positioned outside the edge ring 26 in the radial direction. That is, the outer member 55b is positioned in the region outside the outer edge of the edge ring 26 (see the region E of FIG. 3). Therefore, the outer member 55b and the edge ring 26 do not overlap with each other in a plan view.

The outer member 55b is movable up and down in accordance with abrasion of the edge ring 26. Specifically, the member 32 includes through-holes outside a location at which the inner member 55a is embedded. The through-holes communicate with a groove formed on the bottom surface of the member 32. The groove is formed so as to accommodate the outer member 55b. The height of the groove is approximately equal to the thickness of the outer member 55b. However, the height of the grooves may be greater than or equal to the thickness of the outer member 55b, or may be less than or equal to the thickness of the outer member 55b. Support members 56 are connected to the upper surface of the outer member 55b. The support members 56 penetrate the through-holes, and protrude from the chamber 10. The support members 56 are connected to an actuator 57. The actuator 57 moves the outer member 55b up and down in accordance with an amount of abrasion of the edge ring 26. Note that, in a case in which the outer member 55b is composed of multiple separate members, at least part of the outer member 55b may be moved up and down in accordance with an amount of abrasion of the edge ring 26.

The actuator 57 drives the support members 56 vertically under control of the controller 80, to adjust a height (vertical position) of the outer member 55b. The height (vertical position, travel amount) of the outer member 55b is controlled in accordance with an amount of abrasion of the edge ring 26. Correlation information between a value corresponding to an amount of abrasion of the edge ring 26 and a height of the outer member 55b is measured in advance and stored in the storage device provided in the controller 80. The correlation information is defined such that an etching profile of an etched hole (or recess or the like) formed in an edge region of a substrate can be made vertical or close to vertical, by adjusting the outer member 55b to an appropriate height in accordance with the amount of abrasion of the edge ring 26.

The controller 80 controls a driving amount of the actuator 57 based on the correlation information stored in advance. This allows the actuator 57 to move the outer member 55b to a proper vertical position in accordance with an amount of abrasion of the edge ring 26.

The value corresponding to an abrasion amount of the edge ring 26 may be an abraded amount of thickness of the edge ring 26 relative to the thickness of a new edge ring 26, may be a thickness itself of the edge ring 26, or may be a value indirectly indicating an abrasion amount of the edge ring 26. The present embodiment describes a case in which an application time of radio frequency power for plasma generation is used as the value indirectly indicating an abrasion amount of the edge ring 26. However, a value indirectly indicating an abrasion amount of the edge ring 26 is not limited to an application time of the radio frequency power for plasma generation. In the following description, the radio frequency power for plasma generation may also be referred to as "radio frequency power HF".

The edge ring 26 is abraded as the edge ring 26 is exposed to a plasma. In addition, by the radio frequency power HF being applied to the lower electrode 14 or the like, a plasma is generated. Accordingly, an abrasion amount of the edge ring 26 is proportional to an application time of the radio frequency power HF.

As described above, the application time of the radio frequency power HF can be used as a value indirectly indicating an abrasion amount of the edge ring 26. As an example, in a case in which the application time of the radio frequency power HF is between 0 h and 200 h, the outer member 55b may be controlled such that the outer member 55b is in an initial state, i.e., the outer member 55b is below the inner member 55a, as illustrated in FIG. 1. In a case in which the application time of the radio frequency power HF is between 200 h and 300 h, the outer member 55b may be moved upward, and in a case in which the application time of the radio frequency power HF is between 300 h and 400 h, the outer member 55b may be moved to the highest position, so as to be stored in the groove of the member 32. Note that the above-mentioned application time of the radio frequency power HF is an example of control timing for moving the outer member 55b in the vertical direction, and is not limited thereto.

While a plasma is generated, the plasma is affected by movement of members in the chamber 10. However, the outer member 55b is connected to the ground via the side wall of the chamber 10. Thus, even if the outer member 55b is moved up and down, the plasma is generated stably without being affected by the outer member 55b.

[Height of Outer Member and Experimental Results]

Figure 2:
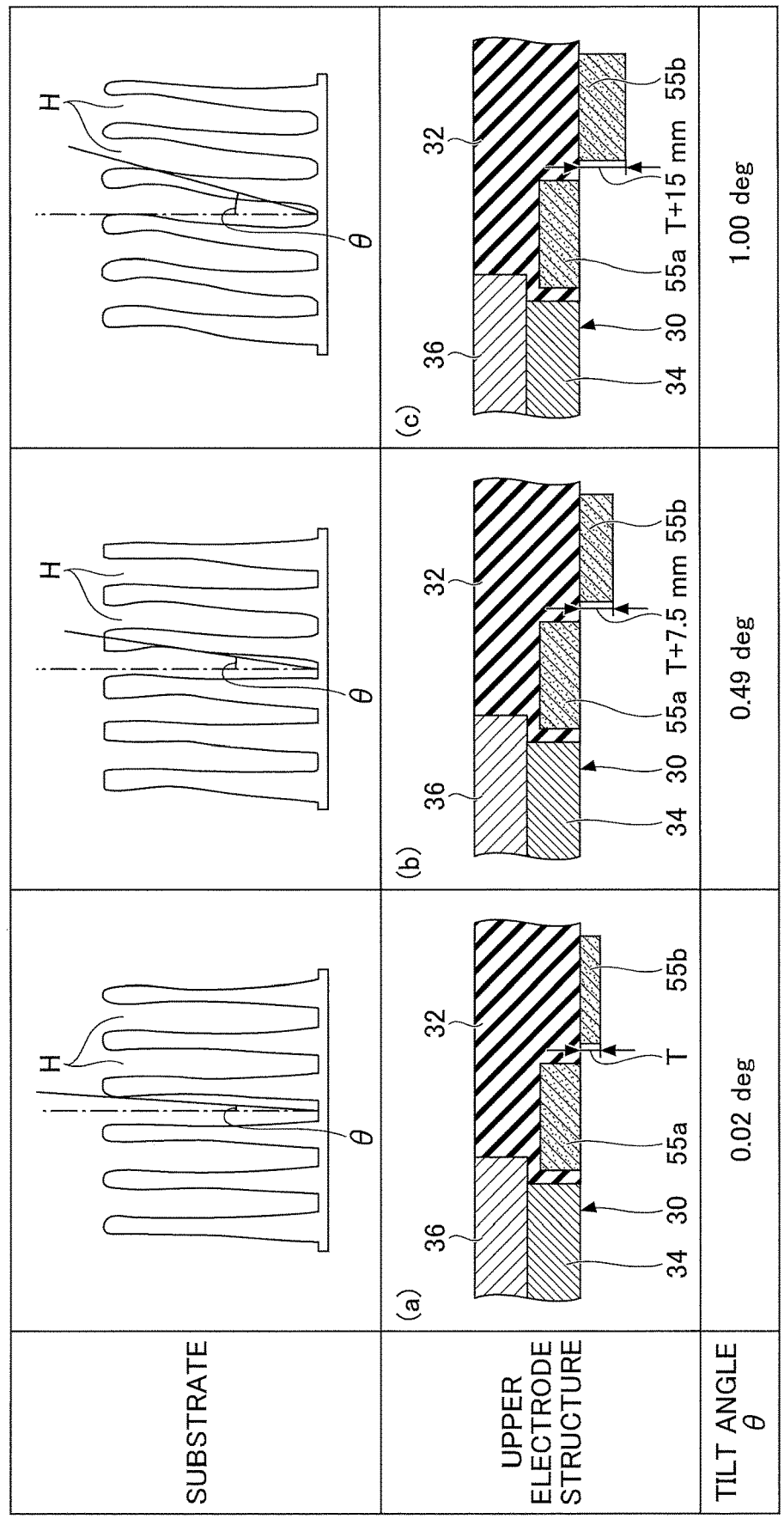
FIG. 2 is a view illustrating examples of tilting shapes in accordance with a thickness of an outer member according to the embodiment.

FIG. 2 illustrates diagrams illustrating an example of changes in tilting shapes of holes H formed in an etching target film, in accordance with the height of the outer member 55b according to the embodiment. The uppermost row of FIG. 2 illustrates experimental results of etching profiles (tilting shapes) of the holes H formed in an edge region of a substrate, which is away from the edge of the substrate by 3 mm in a radial direction, by etching using the plasma processing apparatus 1.

The second row of FIG. 2 illustrates the upper electrode structures in three patterns. For convenience of the experiments, in the experiments of FIG. 2, the outer member 55b was secured to the lower surface of the member 32, and the outer member 55b having different thicknesses is used in each of the three patterns. The upper electrode structures of diagrams (a), (b), and (c) of FIG. 2 differ only in that the height of the outer member 55b in each of the diagrams (a), (b), and (c) differs. Specifically, in a case in which the thickness of the outer member 55b illustrated in the diagram (a) of FIG. 2 was T, the thickness of the outer member 55b illustrated in the diagram (b) of FIG. 2 was (T+7.5) mm, and the thickness of the outer member 55b illustrated in the diagram (c) of FIG. 2 was (T+15) mm.

As a result of the experiments, in a case in which the thickness of the outer member 55b was T as in the diagram (a) of FIG. 2, a "tilt angle θ" which indicates a slope of the sidewall of the hole H formed in the etching target film with respect to a vertical axis was 0.02 (deg). In a case in which the thickness of the outer member 55b was (T+7.5) mm as in the diagram (b) of FIG. 2, the tilt angle θ was 0.49 (deg). In a case in which the thickness of the outer member 55b was (T+15) mm as in the diagram (c) of FIG. 2, the tilt angle θ was 1.00 (deg). From the above experiments, it has been found that the tilt angle θ increases as the height (vertical position) of the lower surface of the outer member 55b becomes lower. In other words, it has been found that the tilt angle θ can be controlled to be zero or close to zero, by moving the outer member 55b in a vertical direction to control the lower surface of the outer member 55b to a proper vertical position.

As the edge ring 26 abrades, the sheath over the edge ring 26 becomes lower than the sheath over the substrate. Thus, incident angles of ions at the edge region of the substrate become slanted. This causes the etching profile to be oblique at the edge region of the substrate (generation of the tilting shape). As the abrasion amount of the edge ring 26 increases, the incident angles of ions increase, and the tilt angle also increases.

Based on the above experimental results, by moving the vertical position of the outer member 55b in accordance with the abrasion amount of the edge ring 26, increase in the incident angles of ions that occurs in the edge region of the substrate in accordance with abrasion of the edge ring 26 can be reduced. Thus, it has been found that an etching profile can be controlled to be vertical or close to a vertical shape, by moving the vertical position of the outer member 55b in accordance with the abrasion amount of the edge ring 26.

Therefore, according to the above-described experimental results, the outer member 55b may be moved upward as the abrasion amount of the edge ring 26 increases. Accordingly, it is possible to suppress inclination of the incident angles of ions in the edge region of the substrate in accordance with the abrasion amount of the edge ring 26. As a result, it is possible to suppress increase in tilting of the etching profile that occurs in accordance with aging (abrasion) of the edge ring 26.

[Processing Method]

Figure 6:
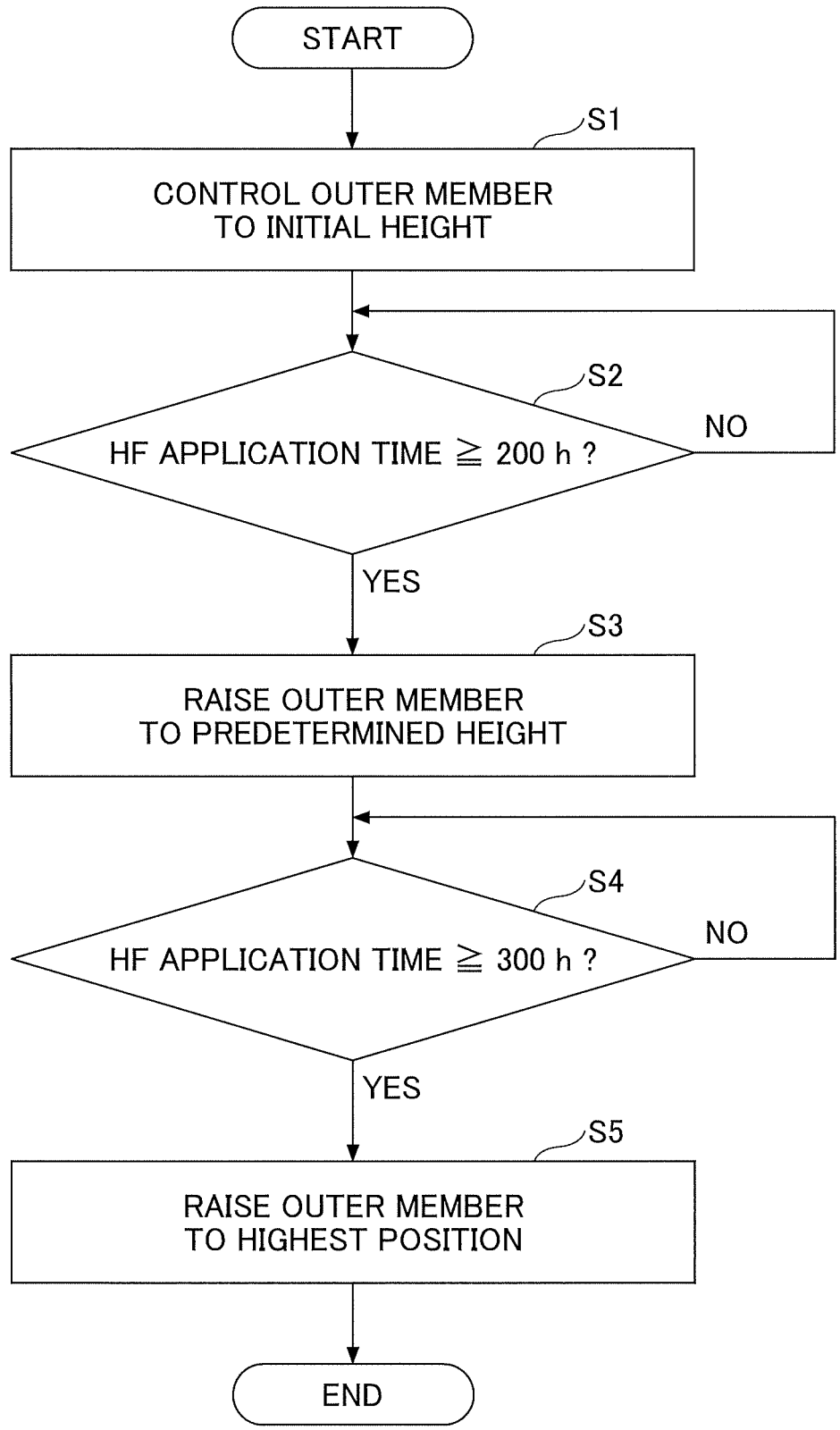
FIG. 6 is a flowchart illustrating an example of a processing method according to the embodiment.

Next, an example of a processing method according to an embodiment will be described with reference to FIG. 6. FIG. 6 is a flowchart illustrating an example of the processing method according to the embodiment. When the present process is started, the controller 80 controls the outer member 55b to be at an initial height (step S1). As an example, the outer member 55b is controlled to be at a height of an initial state illustrated in FIG. 3. However, FIG. 3 illustrates an example of the outer member 55b controlled to be at an initial height, and an initial height of the outer member 55b is not limited thereto.

Next, in FIG. 6, the controller 80 determines whether the application time of the radio frequency power HF for plasma generation has reached or exceeded 200 hours (step S2). The controller 80 does not move the position of the outer member 55b until the application time of the radio frequency power HF reaches or exceeds 200 hours. If it is determined in step S2 that the application time of the radio frequency power HF becomes equal to or longer than 200 hours, the controller 80 raises the outer member 55b to a predetermined height (step S3).

Figure 3:
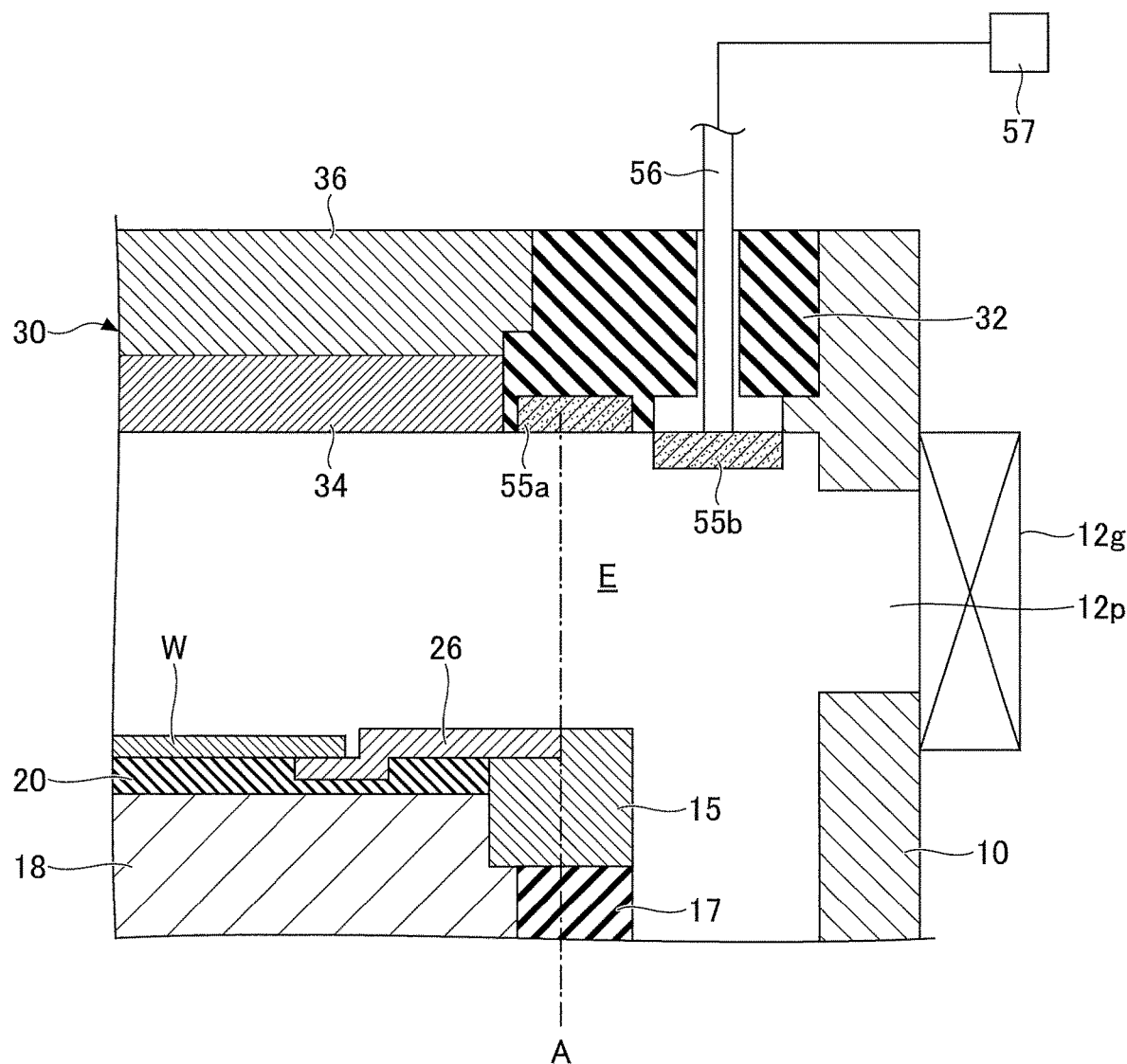
FIGS. 3 to 5 are diagrams illustrating an example of operations of the outer member according to the embodiment.
Figure 4:
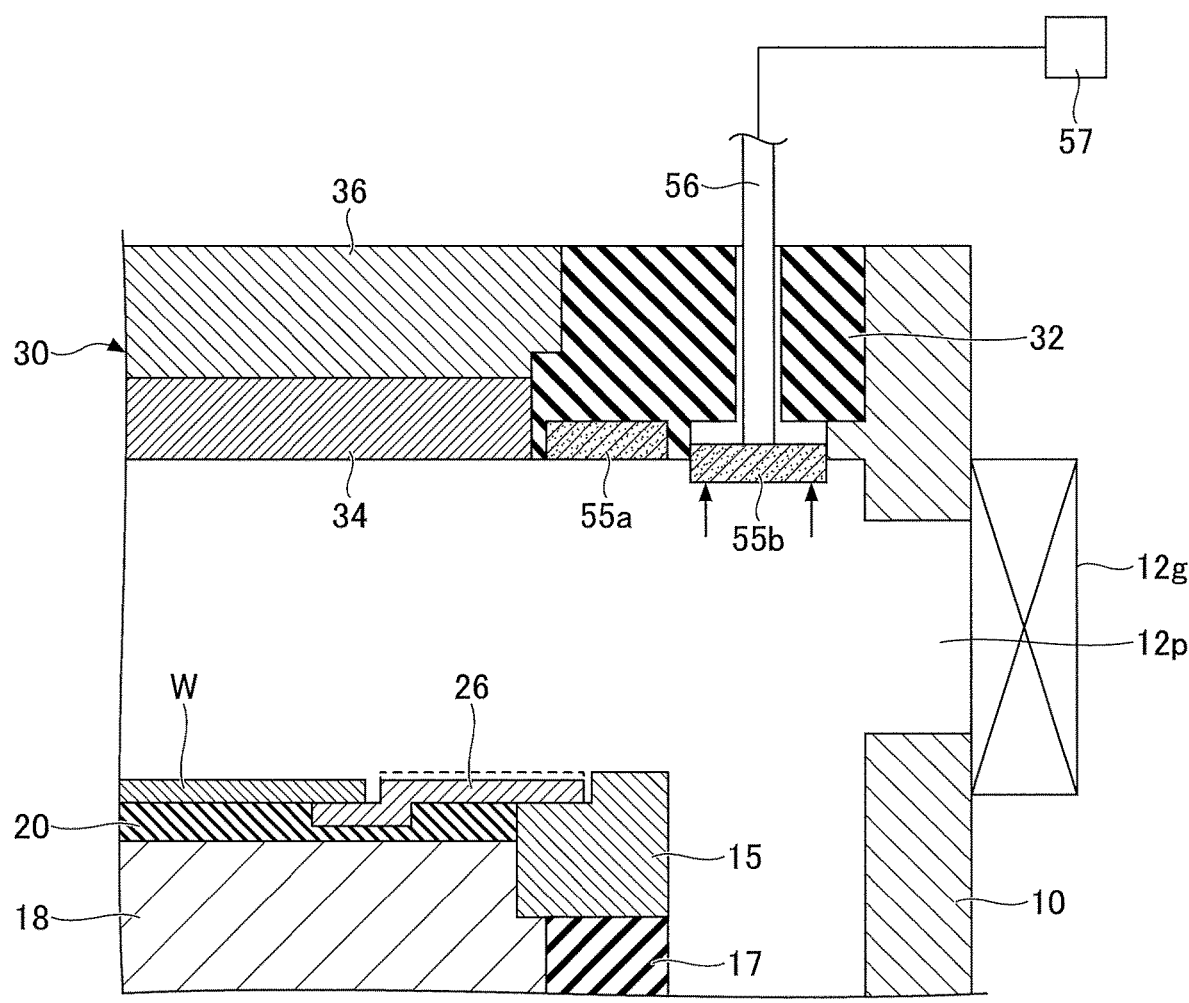
Figure 5:
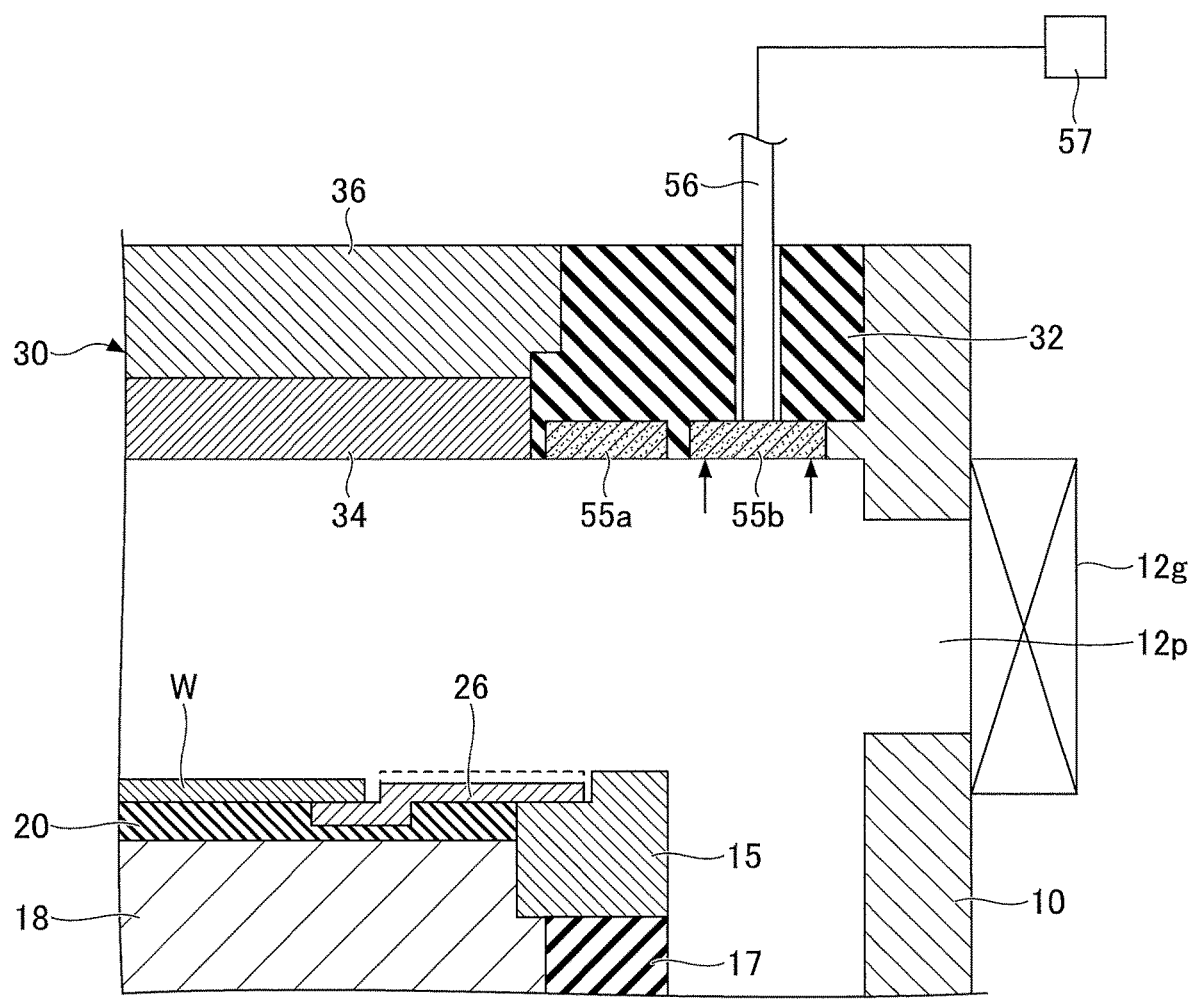

As an example, as illustrated in FIG. 4, the outer member 55b is controlled to be at a height between the initial height of FIG. 3 and the highest position illustrated in FIG. 5. However, FIG. 4 is an example of the outer member 55b controlled to be at a predetermined height, and a predetermined height is not limited to the height illustrated in FIG. 4.

Next, in FIG. 6, the controller 80 determines whether the application time of the radio frequency power HF has reached or exceeded 300 hours (step S4). The controller 80 does not move the position of the outer member 55b until the application time of the radio frequency power HF reaches or exceeds 300 hours. If it is determined in step S4 that the application time of the radio frequency power HF becomes equal to or longer than 300 hours, the controller 80 raises the outer member 55b to the highest position (step S5), and terminates the present process. As an example, the outer member 55b is controlled to be at the highest position illustrated in FIG. 5. However, FIG. 5 is an example of the outer member 55b controlled to be at the highest position, and the highest position is not limited to the position illustrated in FIG. 5.

As described above, in the plasma processing apparatus 1, the processing method, and the upper electrode structure according to the present embodiment, it is possible to suppress increase in tilting of the etching profile that occurs in an edge region of a substrate in accordance with aging (abrasion) of the edge ring.

Note that control of the height of the outer member 55b is not limited to a case of controlling in three stages, as illustrated in FIGS. 3 to 5. That is, movement of the outer member 55b illustrated in FIGS. 3 to 5 is an example of moving the outer member 55b in the vertical direction in accordance with abrasion of the edge ring 26, and a method of moving the outer member 55b is not limited to the above-described example.

The plasma processing apparatus, the processing method, and the upper electrode structure according to the embodiments disclosed herein should be considered exemplary in all respects and not limiting. The above embodiments may be modified and enhanced in various forms without departing from the appended claims and spirit thereof. Matters described in the above embodiments may take other configurations to an extent not inconsistent, and may be combined to an extent not inconsistent.

The plasma processing apparatus of the present disclosure is applicable to any of the following types of apparatuses: an atomic layer deposition (ALD) type processing apparatus, a capacitively coupled plasma (CCP) type processing apparatus, an inductively coupled plasma (ICP) type processing apparatus, a processing apparatus using a radial line slot antenna (RLSA), an electron cyclotron resonance plasma (ECR) type processing apparatus, and a helicon wave plasma (HWP) type processing apparatus.

What is claimed is:

1. An apparatus for plasma processing comprising:
   a chamber;
   a lower electrode on which a substrate is placed in the chamber;
   an edge ring disposed around the lower electrode;
   an upper electrode facing the lower electrode in the chamber;
   a member disposed around the upper electrode, the member including
      an inner member, and
      an outer member positioned outside the inner member, the outer member being movable in a vertical direction;
   a gas supply section configured to supply a process gas to a space between the member and the lower electrode;
   a power supply for applying radio frequency power to the lower electrode or the upper electrode to generate a plasma of the process gas; and
   a controller configured to
      detect an abrasion amount of the edge ring, and
      move the outer member vertically based on the detected abrasion amount.

2. The apparatus according to claim 1, wherein the outer member and the edge ring do not overlap with each other in a plan view.

3. The apparatus according to claim 2, wherein the outer member is electrically insulated from the inner member.

4. The apparatus according to claim 3, further comprising an insulating member connected to an upper opening in the chamber,
   wherein the inner member is fixed to the insulating layer.

5. The apparatus according to claim 4, wherein the outer member is grounded.

6. The apparatus according to claim 1, wherein the outer member is electrically insulated from the inner member.

7. The apparatus according to claim 1, wherein the apparatus is configured to move the outer member upward as the edge ring abrades.

8. The apparatus according to claim 1, further comprising an insulating member connected to an upper opening in the chamber,
   wherein the inner member is fixed to the insulating member.

9. The apparatus according to claim 1, wherein the outer member is grounded.

10. The apparatus according to claim 1, further comprising a memory storing (i) abrasion amounts of the edge ring and (ii) heights of the outer member associated with the abrasion amounts,
    wherein the controller is configured to
       determine a height, of the outer member, associated with the detected abrasion amount, by referring to the memory, and
       move the outer member to the determined height.

11. A method performed in an apparatus for plasma processing including a chamber; a lower electrode on which a substrate is placed in the chamber; an edge ring disposed around the lower electrode; an upper electrode facing the lower electrode in the chamber; a member disposed around the upper electrode, the member including an inner member and an outer member positioned outside the inner member, the outer member being disposed outside the edge ring in a radial direction, the outer member being movable in a vertical direction; a gas supply section configured to supply a process gas to a space between the member and the lower electrode; and a power supply for applying radio frequency power to the lower electrode or the upper electrode to generate a plasma of the process gas;
    the method comprising:
       moving the outer member vertically based on a detected abrasion amount of the edge ring.

12. The method according to claim 11, wherein the detected abrasion amount of the edge ring corresponds to application time of the radio frequency power.

13. The method according to claim 11, wherein the outer member and the edge ring do not overlap with each other in a plan view.

14. The method according to claim 11, wherein the outer member is electrically insulated from the inner member.

15. The method according to claim 11, wherein the apparatus is configured to move the outer member upward as the edge ring abrades.

16. The method according to claim 11, wherein the apparatus further includes an insulating member connected to an upper opening in the chamber, and
    wherein the inner member is fixed to the insulating member.

17. The method according to claim 11, wherein the outer member is grounded.

18. The method according to claim 11, further comprising:
    determining a height, of the outer member, associated with the detected abrasion amount, by referring to a memory, the memory storing (i) abrasion amounts of the edge ring and (ii) heights of the outer member associated with the abrasion amounts; and
    moving the outer member to the determined height.

19. An upper electrode structure comprising:
    an upper electrode; and
    a member disposed around the upper electrode; wherein the member includes
       an inner member, and
       an outer member positioned outside the inner member;
    the outer member is disposed outside an edge ring in a radial direction, the edge ring being disposed around a lower electrode facing the upper electrode; and
    the outer member is movable vertically based on a detected abrasion amount of the edge ring.

* * * * *